(12) United States Patent
Gibson et al.

(10) Patent No.: US 8,240,014 B2
(45) Date of Patent: Aug. 14, 2012

(54) METHOD OF MANUFACTURING A FUEL INJECTOR HAVING AN ENCASED PIEZO ELECTRIC ACTUATOR

(75) Inventors: Dennis H. Gibson, Chillicothe, IL (US); Jinhui Sun, Bloomington, IL (US)

(73) Assignee: Caterpillar Inc., Peoria, IL (US)

(*) Notice: Subject to any disclaimer, the term of this patent is extended or adjusted under 35 U.S.C. 154(b) by 1031 days.

(21) Appl. No.: 12/222,819

(22) Filed: Aug. 18, 2008

(65) Prior Publication Data

US 2008/0315719 A1 Dec. 25, 2008

Related U.S. Application Data

(62) Division of application No. 11/473,135, filed on Jun. 23, 2006, now Pat. No. 7,429,815.

(51) Int. Cl.
*H04R 17/10* (2006.01)
*H01L 41/22* (2006.01)

(52) U.S. Cl. .......... 29/25.35; 29/421.1; 29/454; 72/347; 72/348

(58) Field of Classification Search ............ 29/25.35, 29/832, 834, 421.1, 422, 454; 72/347–349, 72/352; 310/340, 344, 348
See application file for complete search history.

(56) References Cited

U.S. PATENT DOCUMENTS

| | | | |
|---|---|---|---|
| 4,377,894 A * | 3/1983 | Yoshida | 29/421.1 |
| 4,423,616 A * | 1/1984 | Pease | 72/348 |
| 5,004,945 A | 4/1991 | Tomita et al. | |
| 5,113,108 A | 5/1992 | Yamashita et al. | |
| 5,208,506 A | 5/1993 | Yamashita | |
| 5,239,223 A | 8/1993 | Miyoshi | |
| 5,272,797 A | 12/1993 | Miyoshi | |
| 5,334,902 A | 8/1994 | Inoi | |
| 5,406,162 A | 4/1995 | Hasegawa | |
| 5,477,102 A | 12/1995 | Miyoshi | |
| 6,333,586 B1 | 12/2001 | Polach et al. | |
| 6,781,289 B2 | 8/2004 | Heinz et al. | |
| 6,874,475 B2 | 4/2005 | Katsura et al. | |
| 6,962,297 B2 | 11/2005 | Kienzler et al. | |
| 6,969,009 B2 | 11/2005 | Bachmaier et al. | |
| 7,025,292 B2 | 4/2006 | Mohr | |
| 7,145,282 B2 | 12/2006 | Oakley et al. | |

FOREIGN PATENT DOCUMENTS

| | | |
|---|---|---|
| DE | 697 849 | 10/1940 |
| DE | 10 2004 012283 | 11/2004 |
| JP | 58116809 A * | 7/1983 |
| JP | 02-250678 | 10/1990 |
| JP | 05-129674 | 5/1993 |
| JP | 2004297042 A * | 10/2004 |
| WO | WO 99/18346 | 4/1999 |

OTHER PUBLICATIONS

Machine Language Translation of Japanese Patent Publication JP 2004-297042.*

* cited by examiner

*Primary Examiner* — A. Dexter Tugbang
(74) *Attorney, Agent, or Firm* — Finnegan, Henderson, Farabow, Garrett & Dunner LLP

(57) ABSTRACT

A method of fabricating a piezo actuator is disclosed. The method includes forcing a blank against a mold to form a cylindrical casing having an open end and a closed end and rotating the cylindrical casing. The method also includes urging a die having a plurality of equally spaced protrusions into a surface of the cylindrical casing to form bellows in the cylindrical casing. The method further includes positioning a piezo element within the cylindrical casing.

8 Claims, 3 Drawing Sheets

METHOD OF MANUFACTURING A FUEL INJECTOR HAVING AN ENCASED PIEZO ELECTRIC ACTUATOR

CROSS-REFERENCE TO RELATED APPLICATION

This application is a divisional of U.S. patent application Ser. No. 11/473,135, filed Jun. 23, 2006, now U.S. Pat. No. 7,429,815, which is incorporated herein by reference in its entirety.

TECHNICAL FIELD

The present disclosure is directed to a fuel injector and, more particularly, to a fuel injector having an encased piezo electric actuator.

BACKGROUND

Common rail fuel systems typically employ multiple closed-nozzle fuel injectors to inject high pressure fuel into the combustion chambers of an engine. Each of these fuel injectors include a nozzle assembly having a cylindrical bore with a nozzle supply passageway and a nozzle outlet. A needle check valve is reciprocatingly disposed within the cylindrical bore and biased toward a closed position where the nozzle outlet is blocked. To inject fuel, the needle check valve is selectively moved to open the nozzle outlet, thereby allowing high pressure fuel to flow from the nozzle supply passageway into the combustion chamber. To move the needle check valve, a control chamber in fluid communication with a base of the needle check valve is selectively drained of pressurized fuel to create a force imbalance that biases the needle check valve toward the open position.

A piezo actuator is often used to drain the pressurized fuel from the base of the needle check valve. Specifically, the piezo actuator, upon being energized, expands to move a valve element from a first position at which pressurized fuel is directed to the base of the needle check valve, to a second position at which the pressurized fuel at the base of the needle check valve is directed to a drain. Although this configuration is effective for initiating the injection of fuel, it is critical that the piezo actuator remain isolated and protected from the fuel and other contaminates. In particular, fuel, if allowed to contact the piezo actuator, can short circuit the actuator or otherwise degrade the performance of the actuator.

One method utilized by injector manufacturers to isolate the actuator from fuel and other contaminates is described in U.S. Pat. No. 6,874,475 (the '475 patent) issued to Katsura et al. on Apr. 5, 2005. The '475 patent describes a fuel injector for an internal combustion engine. The fuel injector includes a piezo electric valve actuator enclosed within a housing. The housing is made of stainless steel cylindrical bellows consisting of large-diameter portions and small-diameter portions arrayed alternately. The bellows allow expansion and contraction of the piezo electric valve actuator through deformation. The housing is hermetically closed by an upper plate and a lower plate to minimize the ingress of fuel. The upper and lower plates are used to transfer force imparted by the piezo electric valve actuator. One of the lower and upper plates may be formed integral with the housing to improve air tightness.

Although the fuel injector of the '475 patent may sufficiently inject fuel while minimizing piezo/fuel contamination, it may be problematic and costly. For example, because the one of the lower and upper plates and the housing are integral, the material of both the plate and the housing must be the same. This material, when optimized for the deformation described above, may not be optimal for force transmission. Similarly, this material, when optimized for the force transmission described above, may deform poorly. Components fabricated from material that is not optimally suited for intended operations may be prone to premature failure. In addition, because a first material used, for example, to fabricate the housing, may have a higher cost than a second material best suited for the plate, the integral component functioning as both the housing and the plate, which is made of only the first material may unnecessarily increase the cost of the fuel injector. Further, the process of fabricating this integral housing/plate component may be expensive.

The fuel injector of the present disclosure solves one or more of the problems set forth above.

SUMMARY OF THE INVENTION

One aspect of the present disclosure is directed to an actuator. The actuator includes a piezo element, a casing, and at least one end plate. The casing is fabricated through a deep draw process, has bellows, and is configured to house the piezo element. The at least one end plate is hermetically connected to an end portion of the casing.

Another aspect of the present disclosure is directed to a fuel injector. The fuel injector includes a nozzle member, a needle check valve, and an actuator. The nozzle member is configured to receive pressurized fuel and has at least one injection orifice. The needle check valve is disposed with the nozzle member and is movable between a flow blocking position at which fuel flows through the at least one orifice, and a second position at which fuel flow through the at least one orifice is blocked. The actuator is operatively connected to move the needle check valve between the first and second positions, and includes a piezo element, a casing, and at least one end plate. The casing is fabricated through a deep draw process, has bellows fabricated through a thread-rolling process, and is configured to house the piezo element. The at least one end plate is hermetically connected to an end portion of the casing and is operatively connected to the needle check valve.

Yet another aspect of the present disclosure is directed to a method of fabricating a piezo actuator. The method includes forcing a blank against a mold to form a cylindrical casing having an open end and a closed end. The method also includes rotating the cylindrical casing and urging a die having a plurality of equally spaced protrusions into a surface of the cylindrical casing to form bellows in the cylindrical casing. The method also includes positioning a piezo element within the cylindrical casing.

DETAILED DESCRIPTION

Figure 1:
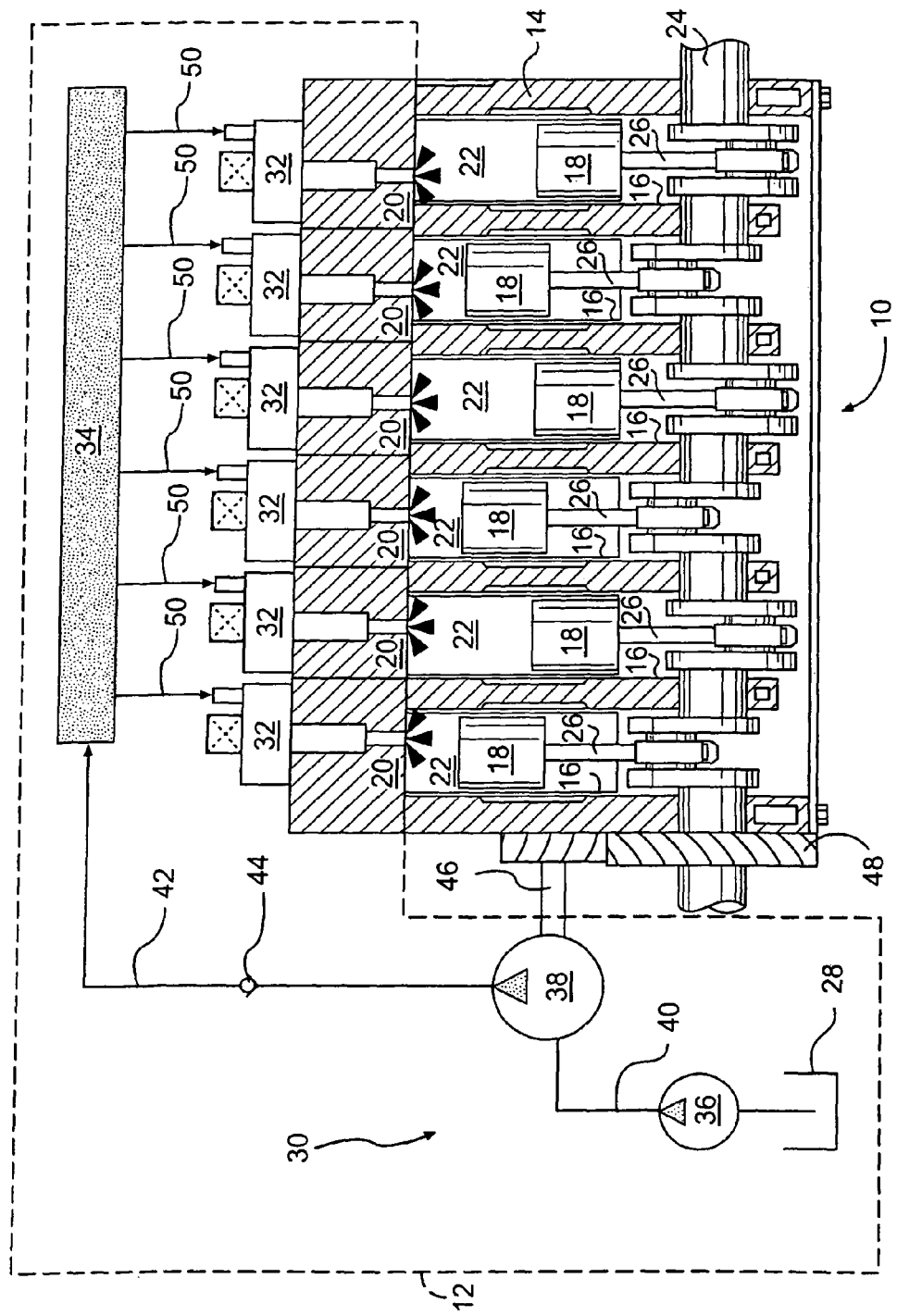
FIG. 1 is a schematic and diagrammatic illustration of an exemplary disclosed fuel system.

FIG. 1 illustrates an engine 10 and an exemplary embodiment of a fuel system 12. For the purposes of this disclosure, engine 10 is depicted and described as a four-stroke diesel engine. One skilled in the art will recognize, however, that engine 10 may embody any other type of internal combustion engine such as, for example, a gasoline or a gaseous fuel-powered engine. Engine 10 may include an engine block 14 that defines a plurality of cylinders 16, a piston 18 slidably disposed within each cylinder 16, and a cylinder head 20 associated with each cylinder 16.

Cylinder 16, piston 18, and cylinder head 20 may form a combustion chamber 22. In the illustrated embodiment, engine 10 includes six combustion chambers 22. However, it is contemplated that engine 10 may include a greater or lesser number of combustion chambers 22 and that combustion chambers 22 may be disposed in an "in-line" configuration, a "V" configuration, or any other suitable configuration.

As also shown in FIG. 1, engine 10 may include a crankshaft 24 that is rotatably disposed within engine block 14. A connecting rod 26 may connect each piston 18 to crankshaft 24 so that a sliding motion of piston 18 within each respective cylinder 16 results in a rotation of crankshaft 24. Similarly, a rotation of crankshaft 24 may result in a sliding motion of piston 18.

Fuel system 12 may include components that cooperate to deliver injections of pressurized fuel into each combustion chamber 22. Specifically, fuel system 12 may include a tank 28 configured to hold a supply of fuel, and a fuel pumping arrangement 30 configured to pressurize the fuel and direct the pressurized fuel to a plurality of fuel injectors 32 by way of a common rail 34.

Fuel pumping arrangement 30 may include one or more pumping devices that function to increase the pressure of the fuel and direct one or more pressurized streams of fuel to common rail 34. In one example, fuel pumping arrangement 30 includes a low pressure source 36 and a high pressure source 38 disposed in series and fluidly connected by way of a fuel line 40. Low pressure source 36 may be a transfer pump configured to provide low pressure feed to high pressure source 38. High pressure source 38 may be configured to receive the low pressure feed and to increase the pressure of the fuel to the range of about 30-300 MPa. High pressure source 38 may be connected to common rail 34 by way of a fuel line 42. A check valve 44 may be disposed within fuel line 42 to provide for one-directional flow of fuel from fuel pumping arrangement 30 to common rail 34.

One or both of low pressure and high pressure sources 36, 38 may be operably connected to engine 10 and driven by crankshaft 24. Low and/or high pressure sources 36, 38 may be connected with crankshaft 24 in any manner readily apparent to one skilled in the art where a rotation of crankshaft 24 will result in a corresponding rotation of a pump drive shaft. For example, a pump driveshaft 46 of high pressure source 38 is shown in FIG. 1 as being connected to crankshaft 24 through a gear train 48. It is contemplated, however, that one or both of low and high pressure sources 36, 38 may alternatively be driven electrically, hydraulically, pneumatically, or in any other appropriate manner.

Fuel injectors 32 may be disposed within cylinder heads 20 and connected to common rail 34 by way of a plurality of fuel lines 50. Each fuel injector 32 may be operable to inject an amount of pressurized fuel into an associated combustion chamber 22 at predetermined timings, fuel pressures, and fuel flow rates. The timing of fuel injection into combustion chamber 22 may be synchronized with the motion of piston 18. For example, fuel may be injected as piston 18 nears a top-dead-center position in a compression stroke to allow for compression-ignited-combustion of the injected fuel. Alternatively, fuel may be injected as piston 18 begins the compression stroke heading towards a top-dead-center position for homogenous charge compression ignition operation. Fuel may also be injected as piston 18 is moving from a top-dead-center position towards a bottom-dead-center position during an expansion stroke for a late post injection to create a reducing atmosphere for aftertreatment regeneration.

Figure 2:
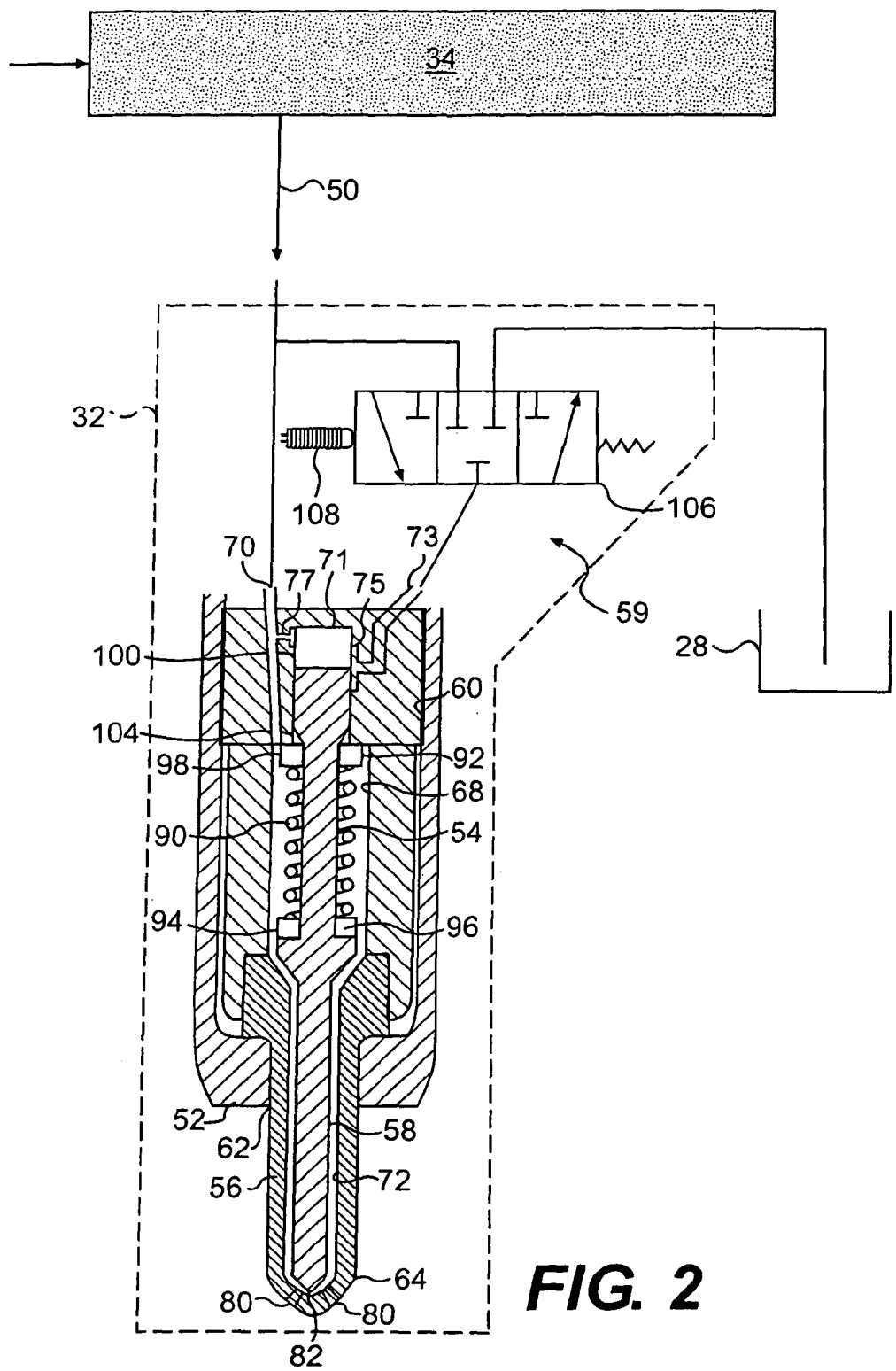
FIG. 2 is a cross-sectional diagrammatic illustration of an exemplary disclosed fuel injector for the fuel system of FIG. 1.

As illustrated in FIG. 2, each fuel injector 32 may embody a closed nozzle unit fuel injector. Specifically, each fuel injector 32 may include an injector body 52 housing a guide 54, a nozzle member 56, a needle valve element 58, and an actuator 59.

Injector body 52 may be a cylindrical member configured for assembly within cylinder head 20. Injector body 52 may have a central bore 60 for receiving guide 54 and nozzle member 56, and an opening 62 through which a tip end 64 of nozzle member 56 may protrude. A sealing member such as, for example, an o-ring (not shown) may be disposed between guide 54 and nozzle member 56 to restrict fuel leakage from fuel injector 32.

Guide 54 may also be a cylindrical member having a central bore 68 configured to receive needle valve element 58, and a control chamber 71. Central bore 68 may act as a pressure chamber, holding pressurized fuel that is continuously supplied from a fuel supply passageway 70. During injection, the pressurized fuel from fuel line 50 may be allowed to flow through fuel supply passageway 70 and central bore 68 to nozzle member 56.

Control chamber 71 may be selectively drained of or supplied with pressurized fuel to control motion of needle valve element 58. Specifically, a control passageway 73 may fluidly connect a port 75 of control chamber 71 with actuator 59. Control chamber 71 may also be continuously supplied with pressurized fluid via a supply passageway 77 that is communication with fuel supply passageway 70. A diameter of supply passageway 77 may be less than a diameter of control passageway 73 to allow for a pressure drop within control chamber 71 when control passageway 73 is drained of pressurized fuel.

Nozzle member 56 may likewise embody a cylindrical member having a central bore 72 that is configured to receive needle valve element 58. Nozzle member 56 may include one or more orifices 80 to allow the pressurized fuel from central bore 68 into combustion chambers 22 of engine 10.

Needle valve element 58 may be an elongated cylindrical member that is slidingly disposed within housing guide 54 and nozzle member 56. Needle valve element 58 may be axially movable between a first position at which a tip end 82 of needle valve element 58 blocks a flow of fuel through orifices 80, and a second position at which orifices 80 are open to allow a flow of fuel into combustion chamber 22.

Needle valve element 58 may be normally biased toward the first position. In particular, as seen in FIG. 2, each fuel injector 32 may include a spring 90 disposed between a stop 92 of guide 54 and a seating surface 94 of needle valve element 58 to axially bias tip end 82 toward the orifice-blocking position. A first spacer 96 may be disposed between spring 90 and stop 92, and a second spacer 98 may be disposed between spring 90 and seating surface 94 to reduce wear of the components within fuel injector 32.

Needle valve element 58 may have multiple driving hydraulic surfaces. In particular, needle valve element 58 may include a hydraulic surface 100 tending to drive needle valve element 58 toward the first or orifice-blocking position when acted upon by pressurized fuel, and a hydraulic surface 104 that tends to oppose the bias of spring 90 and drive needle valve element 58 in the opposite direction toward the second or orifice-opening position.

Actuator 59 may be disposed opposite tip end 82 of needle valve element 58 to indirectly control the motion of needle valve element 58. In particular, actuator 59 may include a three position proportional valve element 106 disposed within control passageway 73 between control chamber 71 and tank 28. Proportional valve element 106 may be actuated to move between a first position at which fuel is allowed to flow from control chamber 71 to tank 28, a second position at which pressurized fuel from fuel line 50 flows through control passageway 73 into control chamber 71, and a third position at which fuel flow through control passageway 73 is blocked. The position of proportional valve element 106 between the first, second, and third positions may determine a flow rate of the fuel through control passageway 73, as well as the flow direction. Proportional valve element 106 may be movable between the first, second, and third positions in response to an electric current applied to a piezo device 108 associated with proportional valve element 106. It is contemplated that proportional valve element 106 may alternatively embody a two-position valve element that is movable between only a control chamber draining position and a control chamber filling position, if desired. It is further contemplated that piezo device 108 may directly move needle valve element 58, without the use of proportional valve element 106, if desired.

Figure 3:
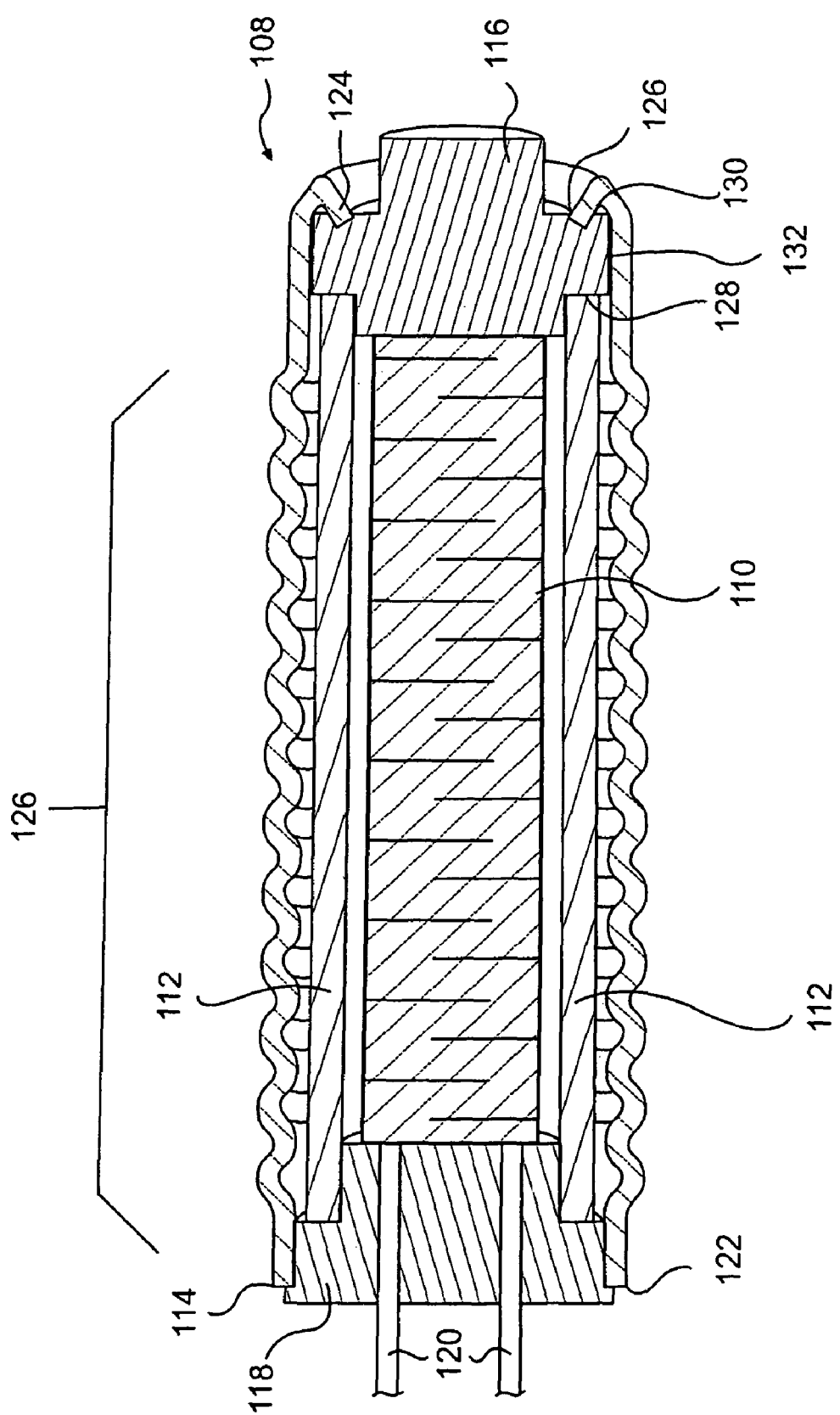
FIG. 3 is a cross-sectional illustration of an exemplary disclosed actuator for use with the fuel injector of FIG. 2.

As illustrated in FIG. 3, piezo device 108 may include a hermetically sealed assembly of multiple component. In particular, piezo device 108 may include a piezo element 110 pre-tensioned by one or more springs 112, an outer casing 114, a first end cap 116, a second end cap 118, and electrical leads 120. Piezo element 110, together with springs 112, first end cap 116, second end cap 118, and electrical leads 120, may be supplied together as a sub-assembly for insertion into and sealing within casing 114. It is contemplated that springs 112 may be omitted and the function of pre-tensioning alternatively performed by casing 114, first end cap 116, and second end cap 118, if desired.

Piezo element 110 may include one or more columns of piezo electric crystals. Piezo electric crystals are structures with random domain orientations. These random orientations are asymmetric arrangements of positive and negative ions that exhibit permanent dipole behavior. When an electric field is applied to the crystals, such as, for example, by the application of a current, the piezo electric crystals expand along the axis of the electric field as the domains line up. Conversely, as the electric field is removed from the crystals, the piezo electric crystals retract along the same axis. The piezo electric crystals may be stacked and compressed a predetermined amount by springs 112.

Casing 114 may house piezo element 110 and provide protection against environmental hazards (e.g., fuel contamination, physical damage, etc.). Casing 114 may include a generally cylindrical wall portion 122 and an end portion 124. Wall portion 122 may include a plurality of alternating large and small diameters that together form bellows 126. In one example, bellows 126 may extend along casing 114 about the same length as piezo element 110, when assembled, to accommodate the expansion and retraction described above. End portion 124 may be integral to wall portion 122, formed of the same material, and bent inward from wall portion 122 toward a central axis (not shown). In one example, end portion 124 may be bent inward through an angle greater than 90 degrees for engagement with first end cap 116.

Wall and end portions 122, 124 may be formed through a deep draw process. Specifically, a metallic blank (not shown) such as, for example, an aluminum blank, may be forced against a mold (e.g., into a female mold or over a male mold) to form a substantially cylindrical-shaped object having an open end and a closed end. In the particular example depicted in FIG. 3, the aluminum blank was forced into a female mold such that end portion 124 was bent through the appropriate angle described above. Once the cylindrical-shaped object is formed, a hole 126 having a diameter less than an inner diameter of wall portion 122 may be made through the closed end of the cylindrical-shaped object, such that only an annular lip structure remains. Hole 126 may be made through a shearing process, reaming process, boring process, or any another known hole-making process. It is contemplated that wall and end portions 122, 124 may alternatively be formed from a metal blank other than aluminum such as, for example, from stainless steel, if desired.

Bellows 126 may be formed within wall portion 122 through a thread-rolling process. In particular, the cylindrical-shaped object described above may be mounted within a machine to rotate or otherwise be spun about its central axis. During this rotation, one or more dies having a plurality of equally spaced, ridge-shaped protrusions may be urged into an outer and/or inner surface of the cylindrical casing, thereby deforming the surface to create bellows within casing 114.

First end cap 116 may be operatively connected to piezo element 110. First end cap 116 may be connected to piezo element 110 to transfer the force associated with the expansion and contraction of piezo element 110 to proportional valve element 106 (referring to FIG. 2). To withstand the forces generated by the expansion of piezo element 110 and the chemical environment within piezo device 108, first end cap 116 may be fabricated from, for example, stainless steel.

To minimize the likelihood of fuel leaking into and contaminating piezo device 108, first end cap 116 may be hermetically sealed to casing 114. Specifically, first end cap 116 may include an inner face 128, an outer face 130, and a cylindrical surface 132 connecting inner and outer faces 128 and 130. Outer face 130 and/or cylindrical surface 132 may be welded, chemically joined, or otherwise sealed to wall and/or end portions 114, 116, respectively. It is contemplated that multiple sealing locations between casing 114 and first end cap 116 may provide improved leakage protection for piezo element 110, as compared to a single sealing location.

Similar to first end cap 116, second end cap 118 may likewise be connected to piezo element 110 and hermetically sealed to casing 114. Second end cap 118 may be connected to an end of piezo element 110 opposing first end cap 116 to transfer the force associated with the expansion and contraction of piezo element 110 in reverse direction to a support of fuel injector 32 (referring to FIG. 2). To withstand the forces generated by the expansion of piezo element 110 and the chemical environment within piezo device 108, second end cap 118 may also be fabricated from stainless steel. An outer cylindrical surface of second end cap 118 may be welded, chemically joined, or otherwise sealed to wall portion 114.

Electrical leads 120 may embody positive and negative conductors that extend through second end cap 116 to direct current into and out of piezo element 110. Electrical leads 120 may be alternatingly connected to layers of crystals within piezo element 110 to create a circuit through each crystal. Electrical leads 120 may be connected to the crystals of piezo element 110 in any manner known in the art.

Industrial Applicability

Although illustrated and described above as being utilized in conjunction with a common rail type fuel injector, the disclosed piezo device may be applicable to any fluid system where it is advantageous to isolate the associated piezo element from the fluid and/or other contaminates of the system. By isolating the piezo element from the fluid while still allowing movement of the piezo element, the piezo device may function as intended and have prolonged component life. In addition, by producing the isolation solution (e.g., the case housing the piezo element) from low cost materials through low cost manufacturing methods, the fluid system incorporating the piezo device may be economical. The operation of fuel injector 32 will now be explained.

Needle valve element 58 may be moved by an imbalance of force generated by fluid pressure. For example, when needle valve element 58 is in the first or orifice-blocking position, pressurized fuel from fuel supply passageway 70 may flow into control chamber 71 to act on hydraulic surface 100. Simultaneously, pressurized fuel from fuel supply passageway 70 may flow into central bore 68 in anticipation of injection. The force of spring 90 combined with the hydraulic force created at hydraulic surface 100 may be greater than an opposing force created at hydraulic surface 104, thereby causing needle valve element 58 to remain in the first position and restrict fuel flow through orifices 80. To open orifices 80 and inject the pressurized fuel from central bore 68 into combustion chamber 22, proportional valve element 106 may be moved to selectively drain the pressurized fuel away from control chamber 71 and hydraulic surface 100. This decrease in pressure acting on hydraulic surface 100 may allow the opposing force acting across hydraulic surface 104 to overcome the biasing force of spring 90, thereby moving needle valve element 58 toward the orifice-opening position. To close orifices 80 and end the injection of pressurized fuel, proportional valve element 106 may be moved to stop fuel from draining away from control chamber 71 and to, instead, fill control chamber 71 with pressurized fuel.

Proportional valve element 106 may be directly moved by piezo device 108. In particular, as current is applied to the crystals of piezo element 110 via electrical leads 120, the crystals within piezo element 110 may expand, resulting in the axial extension of piezo device 108 and the corresponding connected movement of proportional valve element 106. In contrast, as current is removed from the crystals within piezo element 110, the crystals may contract, resulting in the axial retraction of piezo device 10 and the corresponding connected movement of proportional valve element 106. It is contemplated that piezo device 108 may alternatively move proportional valve element 106 indirectly by way of pilot fluid, if desired.

As the crystals within piezo element 110 expand or contract, casing 114 may accommodate the corresponding change in length. In particular, in order to avoid damage to piezo device 108, as the crystals within piezo element 110 expand, bellows 126 of casing 114 may deform to increase the length of casing 114. Conversely, as the crystals within piezo element 110 contract, bellows 120 may return casing 114 to its original shape to decrease the length thereof.

The ability of bellows 126 to deform during the expansion and contraction of piezo element 110 may provide the bias utilized to pre-tension piezo element 110, when springs 112 are omitted. In other words, after fabrication of casing 114, after first end cap 116 has been joined to casing 114, and after piezo element 110 has been inserted into casing 114, second end cap 118 may be inserted into casing 114 a predetermined distance or inserted with a predetermined force such that bellows 126 are slightly deformed and the crystals of piezo element 110 are pre-tensioned when second end cap 118 is joined to casing 114. Pre-tensioning may be implemented to accommodate manufacturing tolerances and ensure that a majority of the piezo movement is transmitted to proportional valve element 106.

The processes and materials used to fabricate casing 114 may reduce the cost and improve the reliability of piezo device 108 and fuel injector 132. Specifically, because deep drawing and thread rolling are both relatively low cost manufacturing methods, and because aluminum is a relatively low cost material, the cost of casing 114 may likewise be inexpensive. In addition, because the material used for casing 114 is dissimilar to the material used for first and second end caps 116, 118, each component may be fabricated from the material best suited for its intended function, without unnecessarily driving up the cost piezo device 108.

It will be apparent to those skilled in the art that various modifications and variations can be made to the fuel injector of the present disclosure without departing from the scope of the disclosure. Other embodiments will be apparent to those skilled in the art from consideration of the specification and practice of the fuel injector disclosed herein. It is intended that the specification and examples be considered as exemplary only, with a true scope of the invention being indicated by the following claims and their equivalents.

What is claimed is:

1. A method of fabricating a piezo actuator, comprising:
   forcing a blank against a mold to form a cylindrical casing having an open end and a closed end;
   rotating the cylindrical casing;
   urging a die having a plurality of equally spaced protrusions into a surface of the cylindrical casing to form bellows in the cylindrical casing; and
   positioning a piezo element within the cylindrical casing.

2. The method of claim 1, further including making a hole in the closed end of the cylindrical casing.

3. The method of claim 2, wherein the hole has a diameter less than an outer diameter of the cylindrical casing.

4. The method of claim 2, further including hermetically sealing a periphery of the hole to a first end plate.

5. The method of claim 4, wherein hermetically sealing includes hermetically sealing the periphery of the hole to an outer face of the first end plate.

6. The method of claim 4, further including hermetically sealing an inner surface of the cylindrical casing to an outer cylindrical surface of the first end plate.

7. The method of claim 4, further including hermetically sealing the open end of the cylindrical casing to a second end plate.

8. The method of claim 7, wherein hermetically sealing the open end of the cylindrical casing to the second end plate pretensions the piezo element.

* * * * *

UNITED STATES PATENT AND TRADEMARK OFFICE
CERTIFICATE OF CORRECTION

PATENT NO.         : 8,240,014 B2
APPLICATION NO.    : 12/222819
DATED              : August 14, 2012
INVENTOR(S)        : Gibson et al.

Page 1 of 1

It is certified that error appears in the above-identified patent and that said Letters Patent is hereby corrected as shown below:

In the Specification

Column 6, line 57, delete "Industrial Applicability" and insert -- INDUSTRIAL APPLICABILITY --.

Signed and Sealed this
Eleventh Day of August, 2015

Michelle K. Lee
*Director of the United States Patent and Trademark Office*